United States Patent
Iwamura

(10) Patent No.: US 9,293,684 B2
(45) Date of Patent: Mar. 22, 2016

(54) ELECTRONIC PART COMPRISING ACOUSTIC WAVE DEVICE

(75) Inventor: Kazuyuki Iwamura, Kirishima (JP)

(73) Assignee: KYOCERA Corporation, Kyoto (JP)

( * ) Notice: Subject to any disclaimer, the term of this patent is extended or adjusted under 35 U.S.C. 154(b) by 264 days.

(21) Appl. No.: 14/236,027

(22) PCT Filed: Jul. 27, 2012

(86) PCT No.: PCT/JP2012/069147
§ 371 (c)(1),
(2), (4) Date: Jan. 29, 2014

(87) PCT Pub. No.: WO2013/018700
PCT Pub. Date: Feb. 7, 2013

(65) Prior Publication Data
US 2014/0175943 A1    Jun. 26, 2014

(30) Foreign Application Priority Data

Jul. 29, 2011 (JP) ................. 2011-167426

(51) Int. Cl.
*H01L 41/053* (2006.01)
*H03H 3/02* (2006.01)
*H03H 9/10* (2006.01)

(52) U.S. Cl.
CPC ............... *H01L 41/053* (2013.01); *H03H 3/02* (2013.01); *H03H 9/1071* (2013.01); *H03H 9/1085* (2013.01); *H01L 2224/16225* (2013.01)

(58) Field of Classification Search
CPC ....... H03H 9/059; H03H 3/08; H03H 9/1021; H01L 41/053
USPC ...... 310/313 A, 313 B, 313 C, 313 D, 313 R, 310/348
See application file for complete search history.

(56) References Cited

U.S. PATENT DOCUMENTS

| | | | | |
|---|---|---|---|---|
| 6,262,513 B1* | 7/2001 | Furukawa | ............... | H01L 21/56 257/E21.502 |
| 8,120,230 B2* | 2/2012 | Takai | ................. | H03H 9/02937 310/313 R |

(Continued)

FOREIGN PATENT DOCUMENTS

| JP | 2007-028172 A | 2/2007 |
|---|---|---|
| JP | 2010-278972 A | 12/2010 |

(Continued)

OTHER PUBLICATIONS

International Search Report dated Aug. 28, 2012, issued for International Application No. PCT/JP2012/069147.

*Primary Examiner* — Shawki S Ismail
*Assistant Examiner* — Bryan Gordon
(74) *Attorney, Agent, or Firm* — Procopio, Cory, Hargreaves & Savitch LLP

(57) ABSTRACT

An electronic component has a mounting board having a mounting surface, a SAW device mounted on the mounting surface, and a sealing part covering the SAW device and filled between the SAW device and the mounting surface. The SAW device has an element substrate, an excitation electrode provided on a major surface of the element substrate and a cover covering the excitation electrode. SAW device is mounted on the mounting surface so as to make top surfaces of the cover face the mounting surface. The sealing part contains a resin and insulating fillers having a coefficient of thermal expansion lower than that of the resin. The content of the fillers differs between an area (for example AR1) including at least a portion of an area between the cover and the mounting surface and other areas (for example AR2 and AR3).

20 Claims, 10 Drawing Sheets

(56) References Cited

U.S. PATENT DOCUMENTS

| | | | | |
|---|---|---|---|---|
| 8,436,514 B2 * | 5/2013 | Fukano | ................ | H03H 9/059 310/313 R |
| 2009/0201102 A1 * | 8/2009 | Oda | ..................... | H03H 3/08 333/193 |
| 2010/0225202 A1 * | 9/2010 | Fukano | ................ | H03H 9/059 310/313 C |
| 2010/0301708 A1 * | 12/2010 | Tsuda | .................. | H03H 9/059 310/344 |
| 2011/0084573 A1 * | 4/2011 | Yamaji | ................ | H03H 9/1092 310/340 |

FOREIGN PATENT DOCUMENTS

| | | |
|---|---|---|
| JP | 2011-103645 A | 5/2011 |
| WO | 2009/057699 A1 | 5/2009 |

\* cited by examiner

ELECTRONIC PART COMPRISING ACOUSTIC WAVE DEVICE

TECHNICAL FIELD

The present invention relates to an electronic component which has an acoustic wave device such as a surface acoustic wave (SAW) device.

BACKGROUND ART

Known in the art is a so-called wafer level packaged acoustic wave device (for example Patent Literature 1). The acoustic wave device in Patent Literature 1 has an element substrate which is comprised of a piezoelectric member, excitation electrodes which provided on a major surface of the element substrate, a cover which covers the excitation electrodes, and terminals which are connected to the excitation electrodes and are exposed from an upper surface of the cover. The acoustic wave device is placed to make a top surface of the cover face a mounting surface of a mounting board, then the terminals are connected by solder with the pads of the mounting surface. Next, the acoustic wave device is covered by a sealing resin whereby it is sealed.

CITATIONS LIST

Patent Literature

Patent Literature 1: WO 2009/057699 A1

SUMMARY OF INVENTION

Technical Problem

An acoustic wave device utilizes acoustic waves (mechanical vibration), therefore has features which are not found in devices which handle only electric signals. For example, deformation of element substrate has an effect upon the frequency of the acoustic wave which is propagated through the element substrate and consequently causes a remarkable drop in the reliability of the acoustic wave device. Further, the cover in Patent Literature 1 forms a space above the excitation electrodes. In other words, the thickness changes, therefore the amount of thermal expansion locally differs. Accordingly, preferably the sealing resin is made a suitable one which is capable of dealing with such circumstances. That is, desirably an electronic component in which the acoustic wave device is suitably sealed is provided.

Solution to Problem

An acoustic wave element according to one aspect of the present invention has a mounting board which has a mounting surface, an acoustic wave device which is mounted on the mounting surface, and a sealing part which covers the acoustic wave device and is filled between the acoustic wave device and the mounting surface. The acoustic wave device has an element substrate, an excitation electrode which is provided on a major surface of the element substrate, and a cover which covers the excitation electrodes and the acoustic wave device is mounted on the mounting surface so as to make a top surface of the cover face the mounting surface. The sealing part contains a resin and insulating fillers which have a coefficient of thermal expansion which is lower than that of the resin. The content of the fillers differs between an area including at least a portion of the area between the cover and the mounting surface and another area.

An electronic component according to another aspect of the present invention has a mounting board which has a mounting surface, an acoustic wave device which is mounted on the mounting surface, and a sealing part which covers the acoustic wave device and is filled between the acoustic wave device and the mounting surface. The acoustic wave device has an element substrate, an excitation electrode which are provided on a major surface of the element substrate, and a cover which covers the excitation electrodes and the acoustic wave device is mounted on the mounting surface so as to make a top surface of the cover face the mounting surface. The sealing part contains a resin and insulating fillers which have a coefficient of thermal expansion which is lower than that of the resin. Fillers which have a particle size which is larger than the particle size of the fillers which are distributed in the area including at least a portion of the area between the cover and the mounting surface are distributed in another area.

Advantageous Effects of Invention

According to the above configurations, the acoustic wave device can be suitably sealed.

BRIEF DESCRIPTION OF DRAWINGS

FIG. 1 is a perspective view of a SAW device according to an embodiment of the present invention.

[FIG. 5]

[FIG. 6]

[FIG. 8]

[FIG. 9]

[FIG. 10]

DESCRIPTION OF EMBODIMENTS

Figure 1:
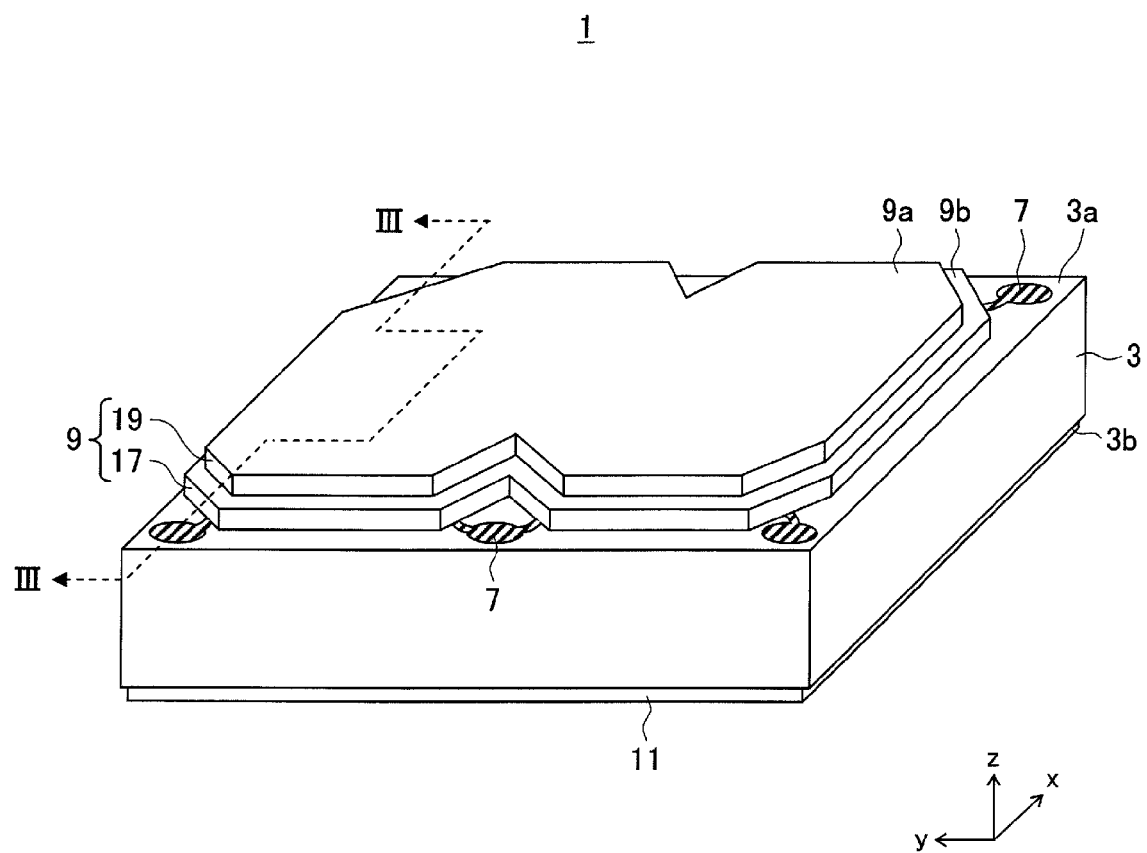
[FIG. 1]

Below, a SAW device according to an embodiment of the present invention will be explained with reference to the drawings. Note that, the drawings used in the following explanation are schematic ones. Dimensions, ratios, etc. in the drawings do not necessarily match with the actual ones.

(Configuration of SAW Device Etc.)

Figure 2:
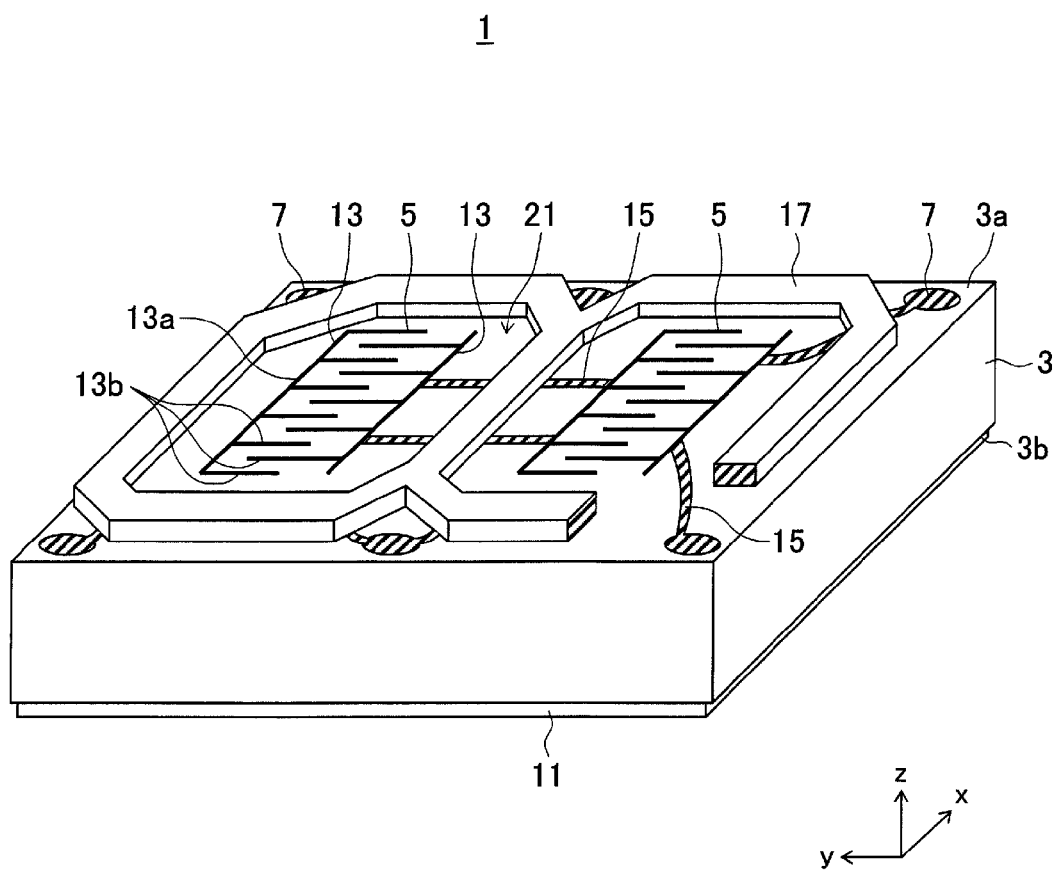
[FIG. 2] A perspective view showing the SAW device in FIG. 1 by cutting away a portion.

FIG. 1 is a perspective view of an outer appearance of a SAW device 1 according to an embodiment of the present invention. Further, FIG. 2 is a perspective view which shows the SAW device 1 by cutting away a portion.

Note that, in the SAW device 1, any direction may be defined as upward or downward. However, in the following embodiment, for convenience, an orthogonal coordinate system xyz is defined, and use is made of terms of "upper surface", "lower surface", etc. for the cover 9 etc. where the positive side of the z-direction (upper side on the drawing sheet in FIG. 1) is the upper part.

The SAW device 1 is configured by a so-called wafer level package (WLP) type SAW device. The SAW device 1 has an element substrate 3, excitation electrodes 5 (FIG. 2) which are provided on a first major surface 3a of the element substrate 3, pads 7 which are provided on the first major surface 3a and are connected to the excitation electrodes 5, a cover 9 (FIG. 1) which covers the excitation electrodes 5 and which exposes the pads 7, and a back surface part 11 which is provided on a second major surface 3b of the element substrate 3.

The SAW device 1 receives as input signals through any of the plurality of pads 7. The input signals are filtered by the excitation electrodes 5 etc. Further, the SAW device 1 outputs the filtered signals through any of the plurality of pads 7. The concrete configurations of the members are as follows.

The element substrate 3 is configured by a piezoelectric substrate. Specifically, for example, the element substrate 3 is configured by a substrate of single crystal which has piezoelectricity such as a lithium tantalate single crystal or a lithium niobate single crystal. The element substrate 3 is for example formed in box shape and has the first major surface 3a and the second major surface 3b which are rectangular, parallel to each other and flat. The size of the element substrate 3 may be suitably set. For example the thickness (z-direction) is 0.2 mm to 0.5 mm, and the length of one side (x-direction or y-direction) is 0.5 mm to 2 mm.

The excitation electrodes 5 are formed in layer shapes (flat plate shapes) on the first major surface 3a. The excitation electrodes 5 are so-called IDT (InterDigital Transducers) and have pairs of comb-shaped electrodes 13. Each comb-shaped electrode 13 has a bus bar 13a which extends in a propagation direction of the surface acoustic wave (x-direction in the present embodiment) on the element substrate 3 and a plurality of electrode fingers 13b which extend from the bus bar 13a in a direction perpendicular to the propagation direction (y-direction in the present embodiment). The two comb-shaped electrodes 13 are arranged so that their electrode fingers 13b mesh (intersect) with each other.

Note that, FIG. 2 is a schematic diagram, therefore shows two pairs of comb-shaped electrodes 13 each having a few electrode fingers 13b. In actuality, two or more pairs of comb-shaped electrodes 13 each having a larger number of electrode fingers than these may be provided. Further, a ladder type SAW filter having a plurality of excitation electrodes 5 connected by serial connection, parallel connection, or another method may be configured, or a double mode SAW resonator filter having a plurality of excitation electrodes 5 arranged in the x-direction may be configured.

The pads 7 are formed in layer shapes on the first major surface 3a. The planar shape of the pads 7 may be suitably set, but is for example a circle. The number and arrangement positions of the pads 7 are suitably set in accordance with the configuration etc. of the filter which is configured by the excitation electrodes 5. The present embodiment exemplifies a case where six pads 7 are arranged along the periphery of the first major surface 3a.

On the first major surface 3a, other than the excitation electrodes 5 and pads 7, provision is made of interconnects 15 (FIG. 2) for connecting the excitation electrodes 5 to each other, connecting the excitation electrodes 5 and pads 7, or connecting the pads 7 to each other. The interconnects 15 are formed in layer shapes on the first major surface 3a. Note that, the interconnects 15 may have not only portions formed on the first major surface 3a, but also portions crossing with these portions in a three-dimensional manner with an insulator interposed therebetween.

The excitation electrodes 5, pads 7, and (portions formed on the first major surface 3a of) interconnects 15 are configured by conductive materials which are the same as each other. The conductive material is for example an Al alloy such as Al—Cu alloy. Further, the excitation electrodes 5, pads 7, and interconnects 15 are for example formed with the same thickness as each other. Their thickness is for example 100 to 300 nm.

Figure 3:
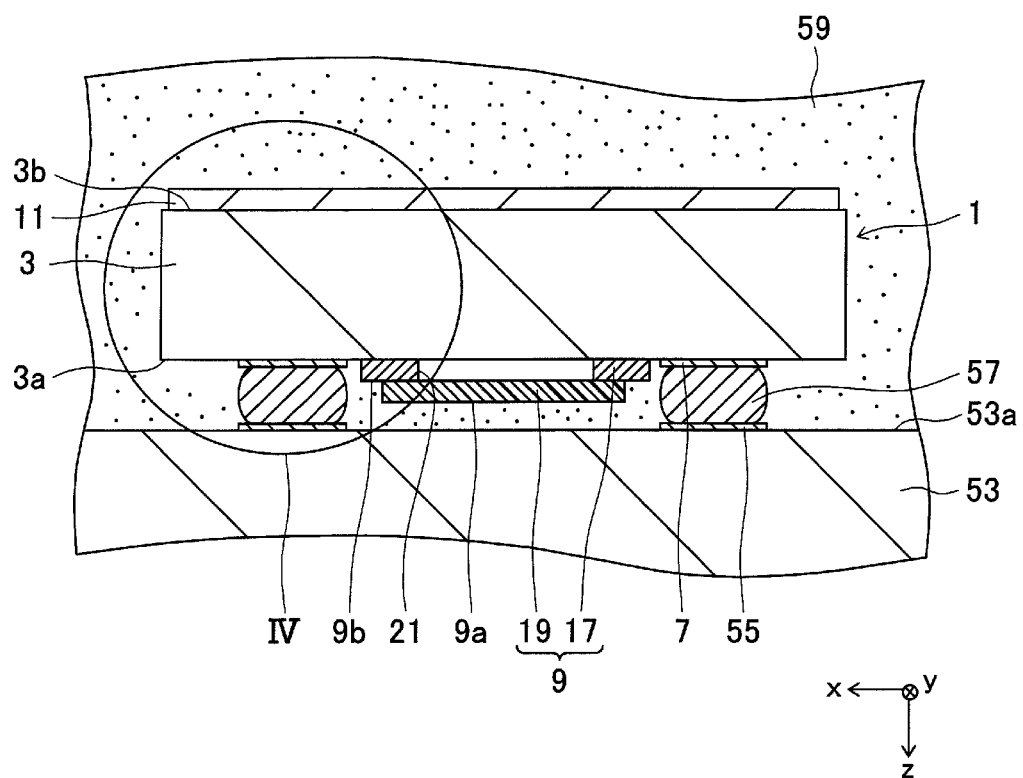
[FIG. 3] A cross-sectional view taken along a III-III line in FIG. 1.

Note that, the pads 7, in addition to layers which are made of the same material and have the same thickness as those of the excitation electrodes 5, may have connection strengthening layers for the purpose of raising the connectivity with the bumps (see FIG. 3). For example, the pads 7 may have a layer of nickel which is superimposed on the layer of Al—Cu alloy and a layer of gold which is superimposed on the layer of nickel.

The cover 9 has a frame 17 (first layer, FIG. 1 and FIG. 2) which is provided on the first major surface 3a and surrounds the excitation electrodes 5 when viewing the first major surface 3a by a plan view and a lid 19 (second layer, FIG. 1) which is superimposed on the frame 17 and closes the opening of the frame 17. Further, the space which is surrounded by the first major surface 3a (strictly speaking, a protective layer 25 which will be explained later), frame 17, and lid 19 forms a vibration space 21 (FIG. 2) for facilitating the vibration of the excitation electrodes 5.

The frame 17 is configured by formation of one or more openings (two in the present embodiment) which become vibration spaces 21 in a layer having roughly a constant thickness. The thickness of the frame 17 (height of the vibration spaces 21) is for example a few μm to 30 μm. The lid 19 is configured by a layer having roughly a constant thickness. The thickness of the lid 19 is for example a few μm to 30 μm.

The planar shapes of inner edge and outer edge of the frame 17 and the planar shape of the lid 19 may be suitably set. In the present embodiment, to be able to avoid the pads 7 which are positioned at the four corners of the vibration space 21 while securing a large area of the vibration space 21, the (outer edge of) frame 17 and lid 19 are shaped as roughly rectangles with cutaway parts which are formed at the positions of the pads 7.

The outer edge of the lid 19 is positioned on the inner side from the outer edge of the frame 17 in at least part (entirety in the present embodiment). That is, the planar shape of the lid 19 is formed smaller than the planar shape of the outer edge of the frame 17. Accordingly, the upper surface of the frame 17 is exposed from the lid 19 at its peripheral sides. In other words, the cover 9 has a first top surface 9a (FIG. 1) and a second top surface 9b (FIG. 1) which is positioned at the periphery of the first top surface 9a and is lower than the first top surface 9a in height from the first major surface 3a. Note that, preferably the outer edge of the frame 17 and the lid 19 are formed as similar shapes, and the second top surface 9b is provided over the entire circumference of the cover 9 with a constant width.

The frame 17 and lid 19 may be formed by the same material or may be formed by materials different from each other. In the present application, for convenience of explanation, the borderline between the frame 17 and the lid 19 is clearly indicated even in the cross-sectional view (FIG. 3 etc.). However, in an actual product, the frame 17 and lid 19 may be formed integrally by the same material as well.

The cover 9 (frame 17 and lid 19) is formed by a photosensitive resin. The photosensitive resin is for example a urethane acrylate-based, polyester acrylate-based, or epoxy acrylate-based resin which is cured by radical polymerization of acryl groups or methacryl groups or other groups.

The back surface part 11, although not particularly shown, has for example a back surface electrode which covers roughly the entire surface of the second major surface 3b of the element substrate 3 and an insulating protective layer which covers the back surface electrode. The back surface electrode discharges the electric charge which is built up at the surface of the element substrate 3 due to a temperature change or the like. The protective layer suppresses damage to the element substrate 3. Note that, in the following description, the back surface part 11 will be sometimes omitted in illustration and explanation.

Other than this, although the illustration is omitted in FIG. 1 and FIG. 2, the first major surface 3a of the element substrate 3 is provided with a protective layer 25 (see FIG. 6C) which covers the excitation electrodes 5 etc. The protective layer 25 contributes to prevention of oxidation etc. of the excitation electrodes 5. The protective layer 25 is formed by for example a silicon oxide ($SiO_2$ etc.), aluminum oxide, zinc oxide, titanium oxide, silicon nitride, or silicone. The thickness of the protective layer 25 is for example about 1/10 of the thickness of the excitation electrodes 5 (10 to 30 nm) or thicker than the excitation electrodes 5 such as 200 nm to 700 nm.

FIG. 3 is a cross-sectional view which shows a portion of an electronic component 51 in which the SAW device 1 is mounted and corresponds to the III-III line in FIG. 1.

The electronic component 51 has a mounting board 53, pads 55 which are provided on the mounting surface 53a of the mounting board 53, bumps 57 which are arranged on the pads 55, the SAW device 1 which is mounted on the mounting surface 53a through the bumps 57, and a sealing part 59 for sealing the SAW device 1.

Note that, the electronic component 51, for example, other than this, has an IC or other electronic element which is mounted on the mounting surface 53a to be connected through the mounting board 53 to the SAW device 1 and sealed together with the SAW device 1 by the sealing part 59 and thereby configures a module. However, the mounting surface 53a need not have an electronic element other than the SAW device 1 mounted as well. For example, the mounting board 53 may be one which is only interposed between the SAW device 1 and another circuit board. The area of the mounting surface 53a may be equal to the SAW device 1.

The mounting board 53 is for example configured by a printed circuit board together with the pads 55 or together with the pads 55 and bumps 57. The printed circuit board may be a rigid board or flexible board. Further, the printed circuit board may be a single layer board or dual layer board or multi-layer board. Further, the base material of the printed circuit board, insulating material, and conductive material may be selected from among suitable materials.

The bumps 57 are formed by a metal which is melted by heating to be bonded to the pads 7. The bumps 57 are configured by for example solder. The solder may be a solder using lead such as a Pb—Sn alloy solder or may be a lead-free solder such as an Au—Sn alloy solder, Au—Ge alloy solder, Sn—Ag alloy solder, and Sn—Cu alloy solder. Note that, the bumps 57 may be formed by a conductive binder as well.

The SAW device 1 is arranged so as to make the top surface side of the cover 9 face the mounting surface 53a. Further, by bonding of the bumps 57 to the pads 7, the SAW device 1 is mounted on the mounting surface 53a. The total thickness of the pads 55, bumps 57, and pads 7 is larger than the thickness of the cover 9, so a gap is formed between the top surface (first top surface 9a) of the cover 9 and the mounting surface 53a. The size of the gap is for example 10 to 20 μm.

The sealing part 59 contains for example an epoxy resin, curing material, and fillers as principal ingredients. The sealing part 59 covers the SAW device 1 from the back surface part 11 side and lateral sides and is filled between the SAW device 1 and the mounting board 53.

Figure 4:
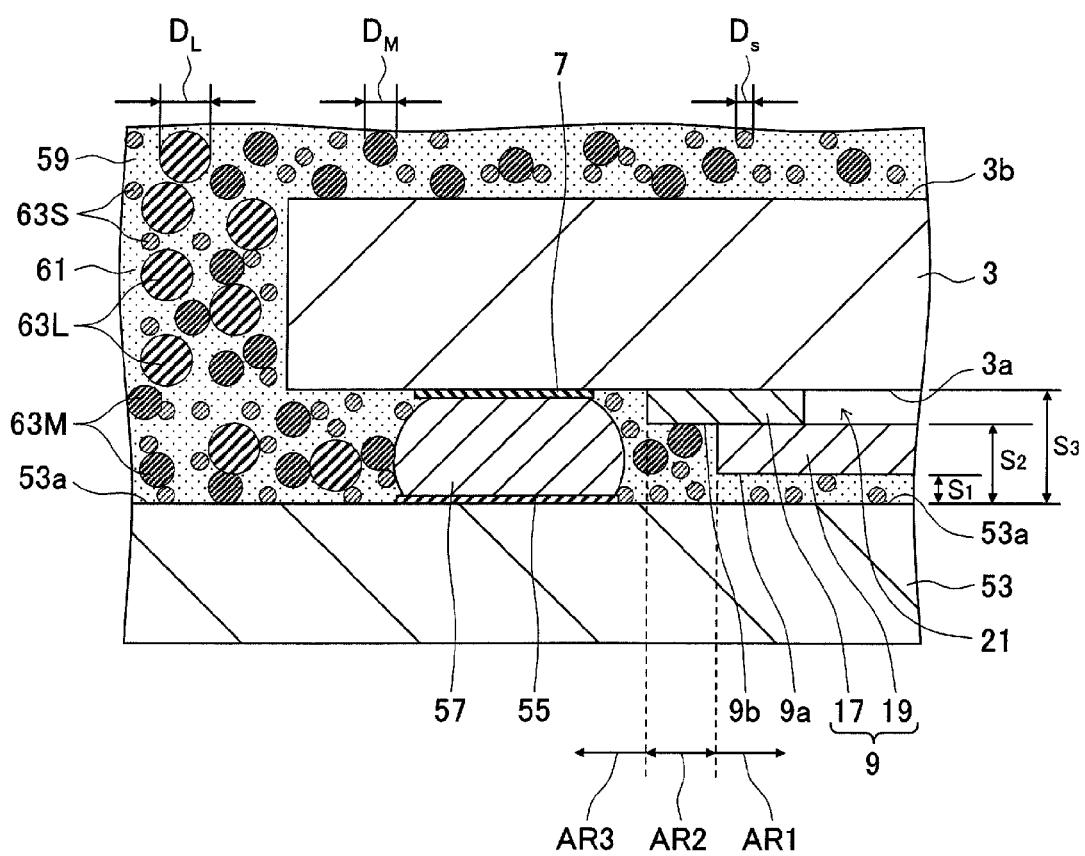
[FIG. 4] An enlarged view of an area IV in FIG. 3.

FIG. 4 is an enlarged view of a region IV in FIG. 3.

The sealing part 59 has a resin 61 and fillers 63S, 63M, and 63L (hereinafter, S, M, and L will be sometimes omitted) which are mixed in the resin 61.

The resin 61 is for example an epoxy resin. The fillers 63 are comprised of insulating particles which have a coefficient of thermal expansion which is lower than that of the resin 61. As the material of the insulating particles, there can be mentioned silica, alumina, phenol, polyethylene, glass fiber, graphite, etc. Preferably use is made of an inorganic material (for example silica). The fillers 63 preferably have curved surfaces, more preferably the fillers 63 are spherical.

The fillers 63S, 63M, and 63L differ from each other only in their sizes. Specifically, when the particle sizes of the fillers 63S, 63M, and 63L are $D_S$, $D_M$, and $D_L$, $D_S<D_M<D_L$ stands.

The particle sizes of the fillers 63 are obtained for example by photographing a polished surface or cleaved surface of the sealing part 59 by using a field emission type electron microscope so as to acquire an enlarged cross-sectional image including a predetermined number of (for example several tens of) fillers 63 and measuring the maximum sizes of the fillers 63 in that image.

Note that, the sizes of the fillers 63S, 63M, and 63L may be compared by cross-sectional area or volume in place of the particle size as well.

Further, FIG. 4 exemplifies a case where the particle sizes of the fillers 63 stepwisely (discretely) change, in other words, where the particle sizes $D_S$, $D_M$, and $D_L$ are roughly constant individually, but the particle sizes of the fillers 63 may continuously vary as well.

When the distance between the first top surface 9a and the mounting surface 53a is $S_1$, the particle size $D_S$ is smaller than $S_1$, preferably is less than 2/3 of the distance $S_1$ or preferably less than a half of the distance $S_1$. For example, if the distance $S_1$ is 18 μm, the particle size $D_S$ is less than 18 μm, preferably less than 12 μm, or preferably less than 9 μm. Note that, the lower limit value of the particle size $D_S$ is for example 0.5 μm.

When the distance between the second top surface 9b and the mounting surface 53a is $S_2$, the particle size $D_M$ is smaller than $S_2$. Further, within a range not contradicting the condition of $D_S<D_M$, the particle size $D_M$ is preferably less than 2/3 of the distance $S_2$ or preferably less than a half of the distance $S_2$. For example, when the distance $S_2$ is 48 μm, the particle size $D_M$ is less than 48 μm or preferably less than 32 μm or preferably less than 24 μm.

Further, within a range not contradicting the condition according to the upper limit described above and the condition of $D_S<D_M<D_L$, the particle size $D_M$ is a half of the distance $S_1$ or more, preferably 2/3 of the distance $S_1$ or more or preferably the distance $S_1$ or more. For example, if the distance $S_1$ is 18 μm, the particle size $D_M$ is 9 μm or more (particle size $D_S$ is less than 9 μm), preferably 12 μm or more (particle size $D_S$ is less than 12 μm) or preferably 18 μm or more.

When the distance between the first major surface 3a of the element substrate 3 (strictly speaking, the surface of the protective layer 25) and the mounting surface 53a is $S_3$, the particle size $D_L$ is for example smaller than $S_3$. Further, within a range not contradicting the condition of $D_M<D_L$, the particle size $D_L$ is preferably less than 2/3 of the distance $S_3$ or preferably less than a half of the distance $S_3$. For example, when the distance $S_3$ is 78 μm, the particle size $D_L$ is less than 78 μm, preferably less than 52 μm or preferably less than 39 μm (particle size $D_M$ is for example less than 24 μm).

Further, within a range not contradicting the condition according to the upper limit described above and the condition of $D_M<D_L$, the particle size $D_L$ is a half of the distance $S_2$ or more, preferably ⅔ of the distance $S_2$ or more or preferably distance $S_2$ or more. For example, if the distance $S_2$ is 48 μm, the particle size $D_L$ is 24 μm or more (particle size $D_M$ is less than 24 μm), preferably 32 μm or more (particle size $D_M$ is less than 32 μm), or preferably 48 μm or more.

In an area AR1 between the first top surface 9a and the mounting surface 53a of the mounting board 53 (area in which the size of the gap is equal to the distance $S_1$), only the fillers 63S are distributed. In an area AR2 between the second top surface 9b and the mounting surface 53a (area in which the size of the gap is equal to the distance $S_2$), the fillers 63S and 63M are distributed. In an area AR3 between the first major surface 3a of the element substrate 3 and the mounting surface 53a (area in which the gap size is equal to the distance $S_3$) and in an area on the lateral side of the element substrate 3 and on the second major surface 3b side, the fillers 63S, 63M, and 63L are distributed.

Further, when the content (volume fraction) of the fillers 63 (63S) in the area AR1, the content of the fillers 63 (63S and 63M) in the area AR2, and the content of the fillers 63 (63S, 63M, and 63L) in the area AR3 are P1, P2, and P3, P1<P2<P3 stands. Predicated on satisfaction of P1<P2<P3, for example, the content P1 is 10 to 50%, the content P2 is 30 to 70%, and the content P3 is 50 to 90%.

Note that the contents of the fillers 63 are obtained for example by photographing a polished surface or cleaved surface of the sealing part 59 by using a field emission type electron microscope, measuring the area ratios of the fillers 63 from that cross-sectional image, and averaging the area ratios for a plurality of cross-sections.

(Method of Production of SAW Device Etc.)

FIG. 5A to FIG. 6C are cross-sectional views for explaining the method of production of the SAW device 1 and electronic component 51 (corresponding to the III-III line in FIG. 1). The manufacture steps proceed from FIG. 5A to FIG. 6C in order.

The steps of FIG. 5A to FIG. 6A corresponding to the method of production of the SAW device 1 are realized in a so-called wafer process. That is, a mother substrate which is to be later divided into element substrates 3 is formed with a thin film, processed by photolithography, and so on. After that, it is diced whereby a large number of SAW devices 1 are formed in parallel. However, in FIG. 5A to FIG. 6A, only a portion corresponding to one SAW device 1 is shown. Further, the conductive layer and insulation layer change in their shapes along with the advance of the process, but common notations will be sometimes used before and after the change.

Figure 5A:
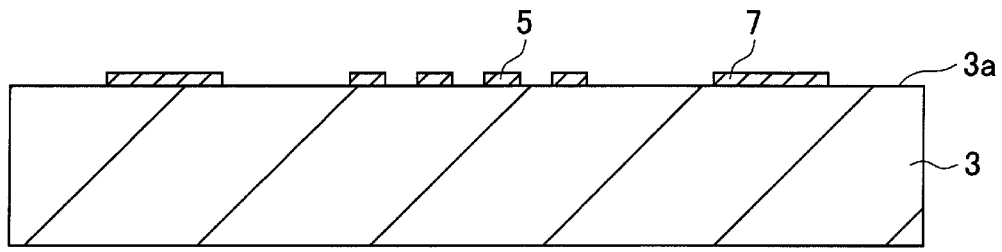
FIG. 5A to FIG. 5D are cross-sectional views for explaining a method of production of the SAW device in FIG. 1.

As shown in FIG. 5A, first, the first major surface 3a of the element substrate 3 is formed with the excitation electrodes 5, pads 7, and interconnects 15 (not shown in FIG. 5A). Specifically, first, the sputtering process, vapor deposition process, CVD (chemical vapor deposition) process or another thin film-forming method is used to form a metal layer on the first major surface 3a. Next, the metal layer is patterned by the photolithography process using a reduced projection exposure machine (stepper) and RIE (reactive ion etching) apparatus. By the patterning, the excitation electrodes 5, interconnects 15, and pads 7 are formed.

Figure 5B:
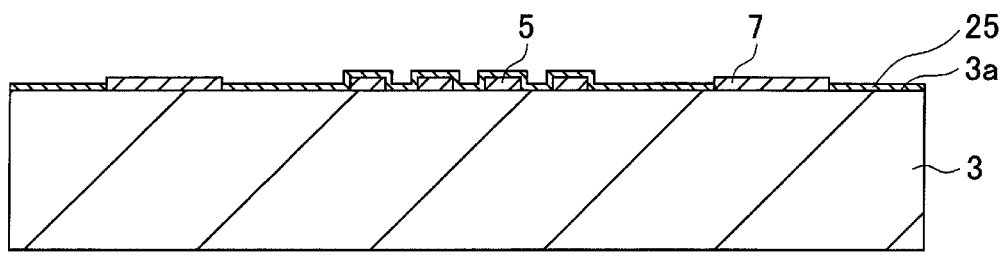

After the excitation electrodes 5 etc. are formed, as shown in FIG. 5B, the protective layer 25 is formed. Specifically, first, a thin film which becomes the protective layer 25 is formed by a suitable thin film-forming method. The thin film-forming method is for example the sputtering process or CVD. Next, portions of the thin film are removed by the photolithography process or the like so that the pads 7 are exposed. Due to this, the protective layer 25 is formed.

Figure 5C:
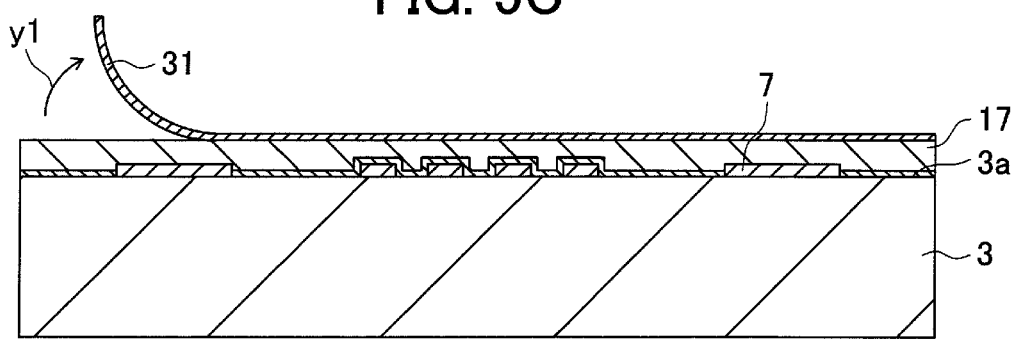

After the protective layer 25 is formed, as shown in FIG. 5C, a thin film made of photosensitive resin which becomes the frame 17 is formed. The thin film is for example formed by adhesion of a film. The film for example has a base film 31 and a resin layer which is superimposed on the base film 31 and becomes the frame 17. The resin layer is adhered onto the protective layer 25, then, as indicated by an arrow y1, the base film 31 is peeled off. Note that, the thin film which becomes the frame 17 may be formed by the same thin film-forming method as that for the protective layer 25.

Figure 5D:
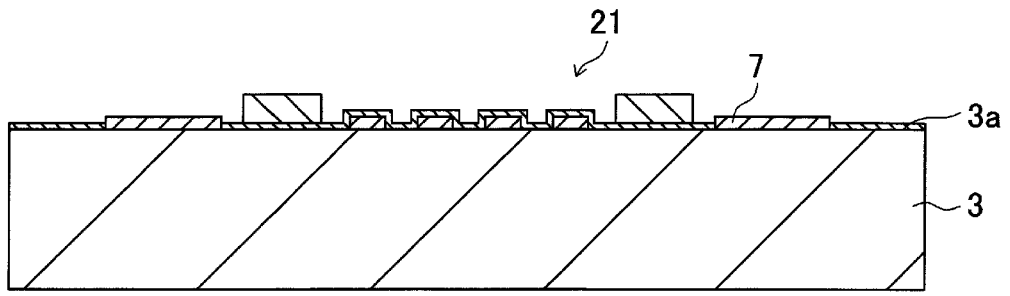

After the thin film which becomes the frame 17 is formed, as shown in FIG. 5D, the photolithography process or the like is used to remove portions of the thin film and form an opening for forming the vibration space 21 and cutaway parts for exposing the pads 7. Further, the thin film is removed by a constant width even on the dicing line. The frame 17 is formed in this way. Note that, in the case where the thin film which becomes the frame 17 is formed by adhesion of a film, the process of peeling off the base film 31 may be carried out after the photolithography as well.

Figure 6A:
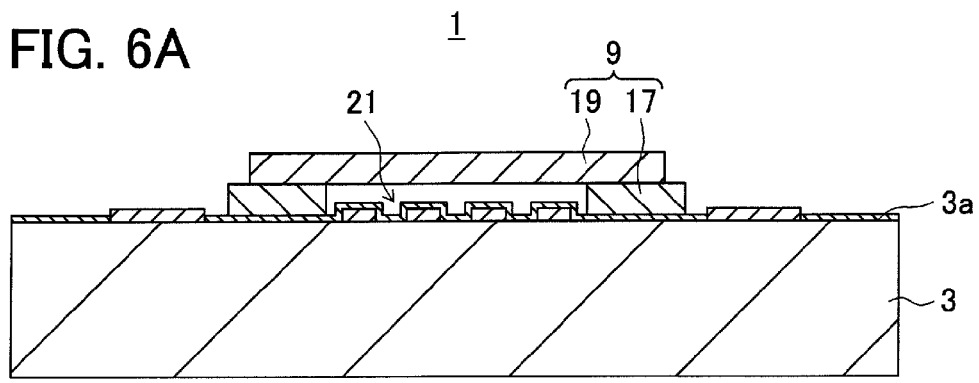
FIG. 6A to FIG. 6C are cross-sectional views showing a continuation of FIG. 5D.

After the frame 17 is formed, as shown in FIG. 6A, the lid 19 is formed. The method of forming the lid 19 is roughly the same as the method of forming the frame 17. Specifically, first, a thin film which is made of a photosensitive resin and becomes the lid 19 is formed. The thin film is for example formed by adhesion of a film in the same way as the frame 17. The thin film is patterned by removing its peripheral portions by the photolithography process or the like.

Figure 6B:
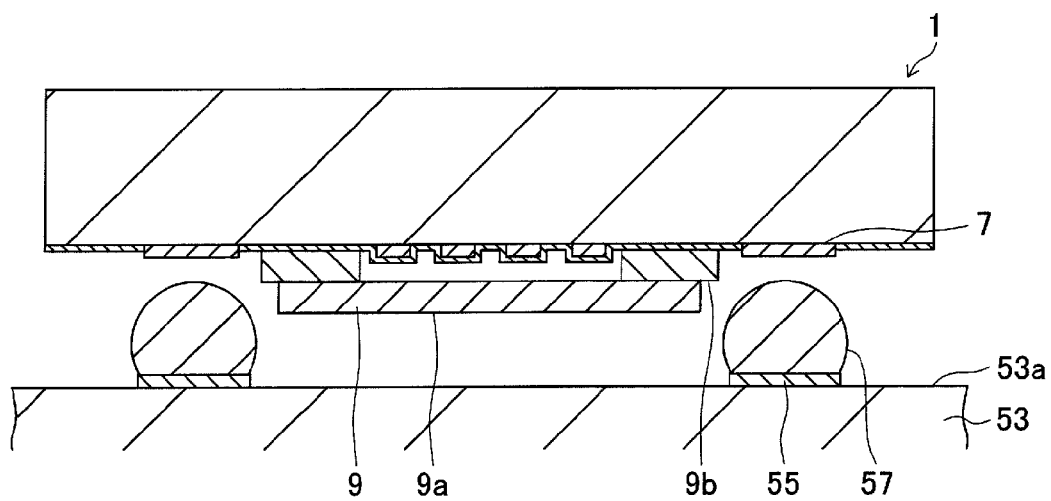

After the lid 19 is formed, as shown in FIG. 6B and the following figures, the SAW device 1 is cut out of the wafer and is mounted on the mounting board 53. As shown in FIG. 6B, before mounting the SAW device 1, bumps 57 are formed on the pads 7 of the SAW element 1, and the pads 55 are provided on the mounting surface 53a of the mounting board 53. The bumps 57 are for example formed by the vapor deposition process, plating method, or printing method and are formed in roughly spherical shapes or semi-spherical shapes due to the influence of surface tension etc. Note that, the bumps 57 may be formed before cutting out the SAW device 1 or may be formed after cutting it out.

Further, the SAW device 1 is arranged so as to make the top surface of the cover 9 (first top surface 9a and second top surface 9b) face the mounting surface 53a. The bumps 57 abut against the pads 55 and support the SAW device 1. After that, the SAW device 1 and mounting board 53 are temporarily heated by passing through a reflow oven or the like, whereby the bumps 57 and pads 55 are fixed by melting and solidification of the bumps 57.

Figure 6C:
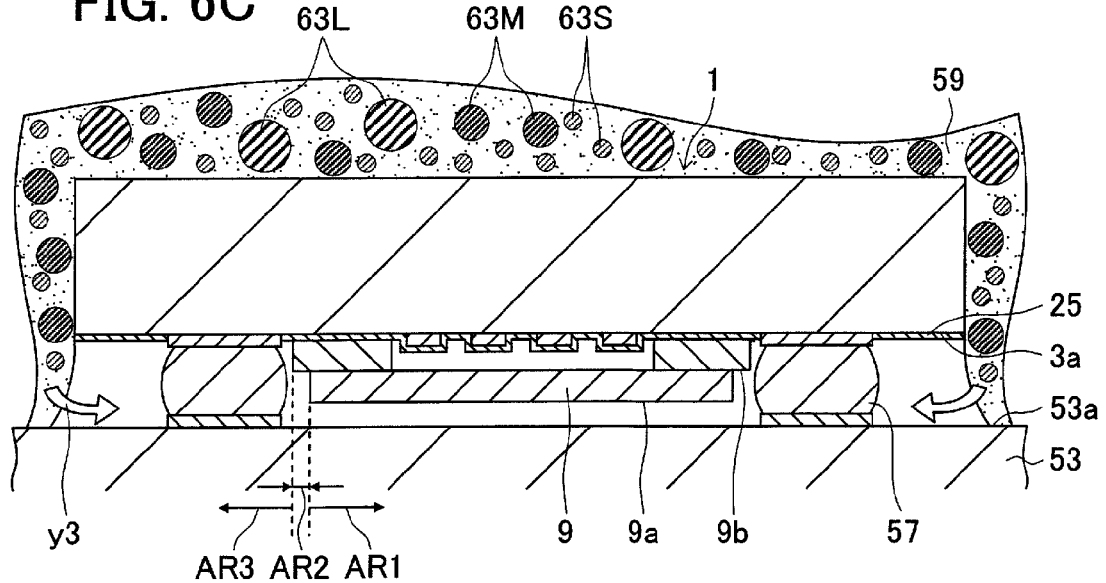

After that, as shown in FIG. 6C, the SAW device 1 is covered by the material which becomes the sealing part 59 (resin 61 in molten state containing fillers 63). The material which becomes the sealing part 59 is supplied to the periphery of the SAW device 1 by for example the transfer molding method or printing method. The sealing part 59 supplied to the periphery of the SAW device 1 flows into a gap between the SAW device 1 and the mounting surface 53a as indicated by an arrow y3 due to the given pressure. Further, when the resin 61 solidifies, as shown in FIG. 3, the electronic component 51 is produced.

In the process of the molten state resin 61 flowing into the gap between the SAW device 1 and the mounting surface 53a, the fillers 63S, 63M, and 63L also flow into the area AR3. However, only the fillers 63S and 63M flow into the area AR2, and further only the fillers 63S flow into the area AR1. That is, when flowing into the progressively narrow areas AR3, AR2, and AR1, the resin 61 becomes sort of filtered in state. Due to this, the distribution of the fillers 63S, 63M, and 63L explained with reference to FIG. 4 is realized.

Note that, for example, the absolute condition of only the fillers 63S flowing into the area AR1 is $D_S < S_1 < D_M (< D_S)$. In actuality, however, only the fillers 63 having a particle size less than ⅔ or less than a half of the distance $S_1$ flow into the area AR1. The reason for this is considered to be the influence of the increase of fluid resistance of the resin 61 along with narrowing of the gap.

When the resin 61 flows into the areas AR3, AR2, and AR1 in that order while being filtered, the number of fillers 63 is gradually decreased. The decreased fillers 63 are large in volume. Therefore the contents P1, P2, and P3 of the fillers 63 become as indicated by P1<P2<P3 as explained above.

In the above embodiment, the electronic component 51 has the mounting board 53 which has the mounting surface 53a, the SAW device 1 which is mounted on the mounting surface 53a, and the sealing part 59 which covers the SAW device 1 and is filled between the SAW device 1 and the mounting surface 53a. The SAW device 1 has the element substrate 3, the excitation electrodes 5 which are provided on the first major surface 3a of the element substrate 3, and the cover 9 which covers the excitation electrodes 5. Further, the SAW device 1 is mounted on the mounting surface 53a so as to make the top surface (9a, 9b) of the cover 9 face the mounting surface 53a. The sealing part 59 contains the resin 61 and insulating fillers 63 having a coefficient of thermal expansion lower than that of the resin 61. The content of the fillers 63 differs in the area including at least a portion of the area between the cover 9 and the mounting surface 53a (for example area AR1) and other areas (for example AR2 and AR3).

Accordingly, the coefficient of thermal expansion of the sealing part 59 can be controlled in accordance with the position of the SAW device 1. As a result, for example, the coefficient of thermal expansion of the sealing part 59 is locally adjusted by taking the shape and coefficient of thermal expansion of the cover 9 into account, and thus the deformation of the SAW device 1 can be suppressed as a whole.

Further, in the present embodiment, the first major surface 3a of the element substrate 3 is exposed at the periphery of the cover 9, and the content of the fillers 63 is higher between the first major surface 3a and the mounting surface 53a (in the area AR3) than between the cover 9 and the mounting surface 53a (in the areas AR1 and AR2).

Accordingly, for example, the coefficient of thermal expansion of the sealing part 59 approaches the coefficient of thermal expansion of the cover 9 (generally relatively high) in the area in which it is superimposed on the cover 9, while approaches the coefficients of thermal expansion of the element substrate 3 and mounting board 53 (generally relatively low) in the area in which it is not superimposed on the cover 9. As a result, for example, both easing of thermal stress (improvement of adhesive strength) between the cover 9 and the sealing part 59 in the direction of the xy plane and easing of thermal stress (improvement of adhesive strength) between the element substrate 3 etc. and the sealing part 59 in the direction of the xy plane are achieved. Further, cracking of the cover 9 due to the thermal stress in the direction of the xy plane is suppressed.

Further, in the present embodiment, the fillers 63L having a particle size ($D_L$) larger than the maximum particle size ($D_M$) of the fillers 63 which are distributed between the cover 9 and the mounting surface 53a are distributed between the first major surface 3a and the mounting surface 53a.

Accordingly, due to the pinning effect of the fillers 63L having the relatively large particle size, cracking in the area AR3 is effectively suppressed. Cracks occur from the end parts in which stress tends to concentrate. Therefore, by suppression of advance of cracks at the periphery of the cover 9, the cover 9 is effectively protected. Further, the method of production of the present embodiment can be utilized when the particle size of the fillers 63 is large in the region AR3 which is at the peripheral sides of the cover 9 and has a high content of the fillers 63. That is, the content of the fillers 63 can be adjusted by filtering the resin 61.

Further, in the present embodiment, the cover 9 has the first top surface 9a facing the mounting surface 53a and the second top surface 9b which faces the mounting surface 53a while separated from the mounting surface 53a more than the first top surface 9a. The content of the fillers 63 is higher between the second top surface 9b and the mounting surface 53a (area AR2) than between the first top surface 9a and the mounting surface 53a (area AR1).

Accordingly, for example, in the area AR1 in which the sealing part 59 and the cover 9 (first top surface 9a) are only adhered to each other, the stress difference between the sealing part 59 and the first top surface 9a in the direction of the xy plane is ease to improve the adhesive strength, while the coefficient of thermal expansion of the sealing part 59 is lowered in the area AR2 in which the sealing part 59 and the cover 9 engage with each other in the direction of the xy plane, thus peeling of the sealing part 59 from the mounting surface 53a can be suppressed.

Further, in the present embodiment, the cover 9 has the frame 17 which surrounds the excitation electrodes 5 when viewing the first major surface 3a by a plane view and the lid 19 which is superimposed on the frame 17 so as to close the opening of the frame 17. The first top surface 9a is configured by the top surface of the lid 19, and the second top surface 9b is configured by a portion in the top surface of the frame 17 which is exposed from the lid 19.

Here, the thermal expansion in z-direction of the cover 9 causes a force by which the frame 17 presses against the first major surface 3a. Further, the amount of thermal expansion in the z-direction of the cover 9 is larger in the portion in which the frame 17 and the lid 19 are superimposed (portion surrounding the vibration space 21 when viewed by a plane view) than in the portion in which only the lid 19 exists (portion above the vibration space 21). Accordingly, the first major surface 3a is pressed down at the peripheral sides of the functional surface (surface on which the acoustic wave vibrates) and thereby cause bending deformation of the functional surface. This deformation has an influence upon the frequency etc. of the SAW. However, by removal of a portion of the lid 19 (portion above the second top surface 9b) and, further, lowering of the coefficient of thermal expansion of the portion in the sealing part 59 which is superimposed on the second top surface 9b, the deformation of the functional surface is effectively suppressed. Further, if looking at the manufacturing steps, the first top surface 9a and second top surface 9b can be simply configured by utilizing the frame 17 and lid 19.

Further, in the present embodiment, the second top surface 9b is configured by the portion in the top surface of the frame 17 which is exposed from the peripheral sides of the lid 19.

Here, the moment causing bending deformation of the functional surface (first major surface 3a) becomes larger as the pushing force at the peripheral sides becomes larger. Accordingly, by lowering the coefficient of thermal expansion at the periphery of the lid, the bending deformation of the functional surface can be effectively suppressed. Further, if looking at the manufacturing steps, due to the formation of the second top surface 9b at the peripheral sides, the method of adjusting the content of the fillers 63 by filtering the resin 61 can be utilized.

Further, in the present embodiment, the fillers 63M which have a particle size ($D_M$) which is larger than the maximum particle size ($D_S$) of the fillers 63S which are distributed between the first top surface 9a and the mounting surface 53a (in area AR1) are distributed between the second top surface 9b and the mounting surface 53a (in area AR2).

Accordingly, due to the pinning effect of the fillers 63M which have the relatively large particle size, cracking in the area AR2 is effectively suppressed. Further, by suppression of advance of cracks from the area AR2 to the area AR1 side, the cover 9 is effectively protected. Further, the method of production of the present embodiment can be utilized when the particle size of the fillers 63 is larger than that in the area AR1 at the area AR2 which is the peripheral sides of the first top surface 9a and in which the content of the fillers 63 is higher than that in the area AR1. That is, the content of the fillers 63 can be adjusted by filtering the resin 61.

From another viewpoint, the electronic component 51 in the present embodiment has the mounting board 53 which has the mounting surface 53a, the SAW device 1 which is mounted on the mounting surface 53a, and the sealing part 59 which covers the SAW device 1 and is filled between the SAW device 1 and the mounting surface 53a. The SAW device 1 has the element substrate 3, the excitation electrodes 5 which provided on the first major surface 3a of the element substrate 3, and the cover 9 which covers the excitation electrodes 5. Further, the SAW device 1 is mounted on the mounting surface 53a so as to make the top surface (9a, 9b) of the cover 9 face the mounting surface 53a. The sealing part 59 contains the resin 61 and the insulating fillers 63 which have a coefficient of thermal expansion lower than that of the resin 61. Further, fillers 63 which have particle sizes larger than the particle sizes of the fillers 63 which are distributed in the areas including at least a portion of the area between the cover 9 and the mounting surface 53a (for example area AR1) are distributed in other areas (for example area AR3).

Accordingly, for example, the pinning effect can be effectively exerted at the peripheral sides of the cover 9 at which cracks are apt to occur. Further, if looking at the manufacturing steps, the content of the fillers 63 can be controlled by filtration of the resin 61 as well.

The present invention is not limited to the above embodiments and may be worked in various ways.

The acoustic wave device is not limited to a SAW device. For example, the acoustic wave device may be a thin film piezoelectric resonator or may be an elastic boundary wave device (note, included in SAW devices in a broad sense). Note that, in the elastic boundary wave device, a vacant space (vibration space) above the excitation electrodes is unnecessary. In other words, the cover does not have to have a frame and a lid, but may be formed by only one layer. Further, in the elastic boundary wave device, the protective layer may be used also as the cover, or vice versa.

Further, in an acoustic wave device, the protective layer and back surface part are not essential requirements and may be omitted. Conversely, in an acoustic wave device, a conductive layer which is positioned between the frame and the lid, a metal reinforcing layer which is superimposed on the top surface of the cover (note, it may be grasped as a portion of the cover as well), or another suitable layer may be added as well. Further, not connecting the pads on the element substrate and the pads on the mounting board by the bumps, but by providing columnar terminals penetrating through the cover on the pads of the element substrate and connecting those columnar terminals and the pads on the mounting board by the bumps is also possible.

The relative relationships among outer edges of the element substrate, the frame and lid may be suitably set. The areas in which the contents or particle sizes of the fillers are different from each other may be suitably set as well. FIG. 7 to FIG. 9B show examples.

Figure 7:
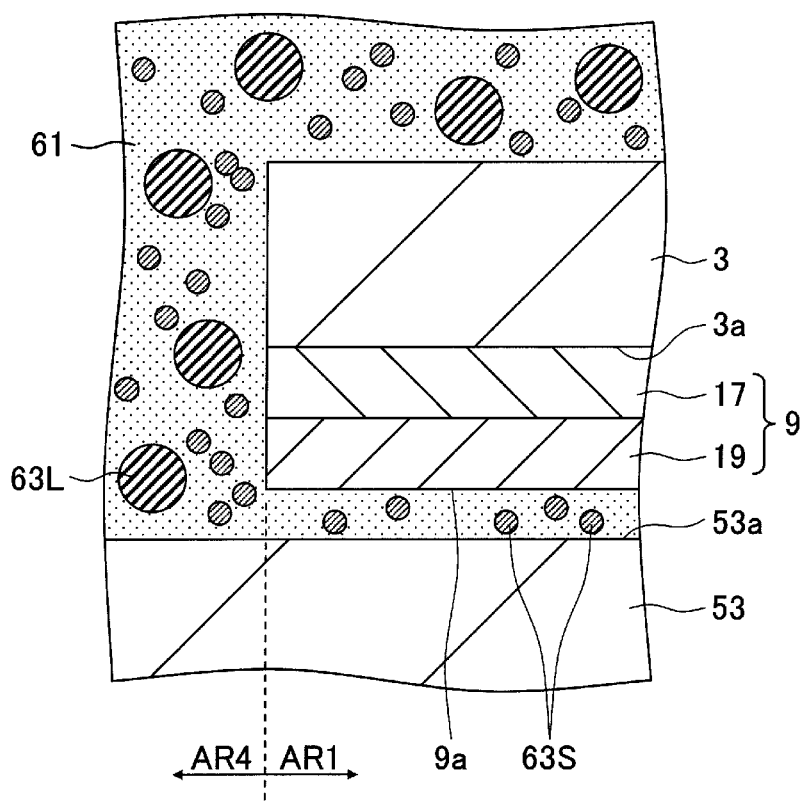
[FIG. 7] An enlarged cross-sectional view showing a modification of the SAW device.

FIG. 7 exemplifies a case where the first major surface 3a of the element substrate 3 is not exposed from the cover 9, and the cover 9 has only the first top surface 9a configured by the lid 19 and does not have the second top surface 9b.

In the area AR1 between the first top surface 9a and the mounting surface 53a, only the fillers 63S are distributed. In the area AR4 on the outer side of the same, the fillers 63S are distributed and the fillers 63L and/or 63M (only 63L is shown in FIG. 7) are distributed. Further, the content of the fillers 63 is higher in the area AR4 than in the area AR1.

Figure 8A:
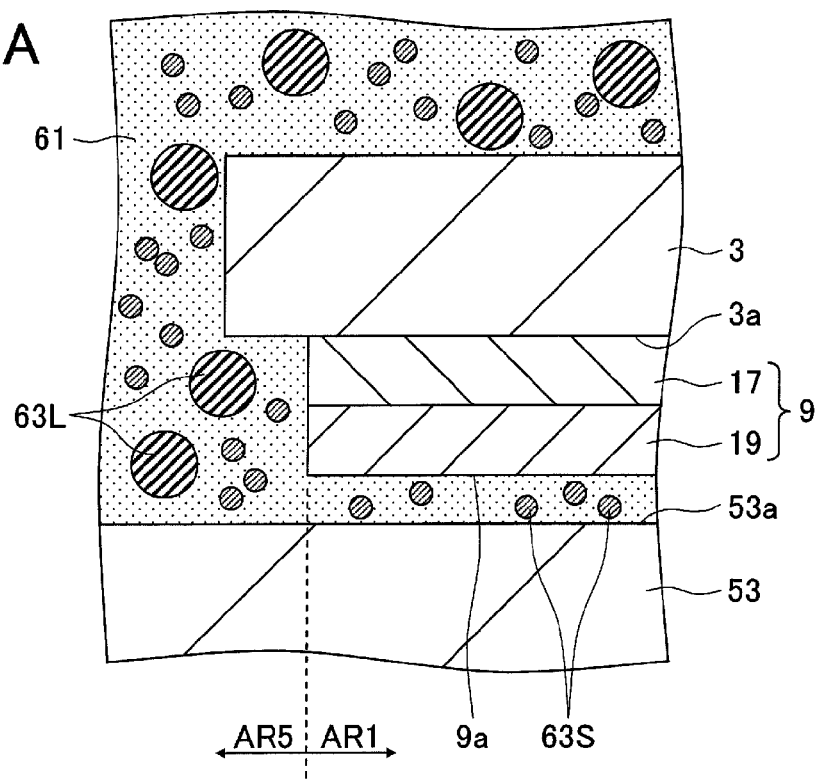
FIG. 8A and FIG. 8B are enlarged cross-sectional views showing modifications of the SAW device.
Figure 8B:
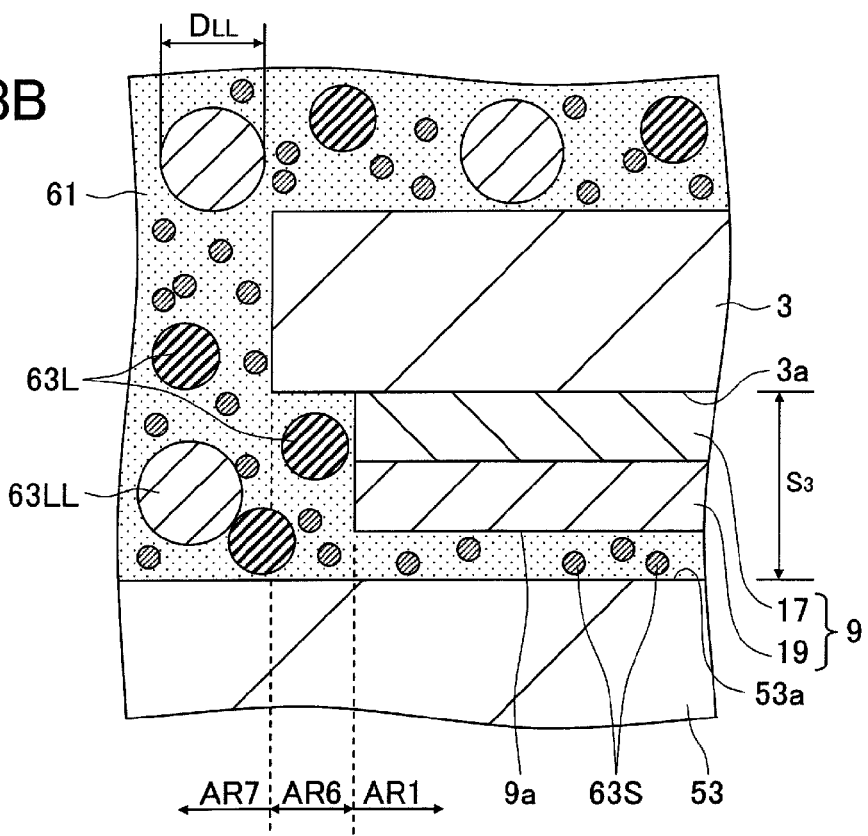

FIG. 8A and FIG. 8B exemplify a case where the first major surface 3a of the element substrate 3 is exposed from the cover 9, but the cover 9 has only the first top surface 9a configured by the lid 19 and does not have the second top surface 9b.

In FIG. 8A, in the area AR1 between the first top surface 9a and the mounting surface 53a, only the fillers 63S are distributed, while in the area AR5 on the outer side of the same, the fillers 63S are distributed and the fillers 63M and/or 63L (only 63L is shown in FIG. 8A) are distributed. Further, the content of the fillers 63 is higher in the area AR5 than in the area AR1.

In FIG. 8B, in the area AR1 between the first top surface 9a and the mounting surface 53a, only the fillers 63S are distributed, in the area AR6 between the first major surface 3a and the mounting surface 53a, the fillers 63S are distributed and the fillers 63M and/or 63L (only 63L is shown in FIG. 8B) are distributed, while in the area AR7 on the outer side of the same, the fillers 63S and the fillers 63M and/or 63L (only 63L is shown in FIG. 8B) are distributed and the fillers 63LL are distributed. Further, the content of the fillers 63 is higher in the area AR6 than that in the area AR1, and is higher in the area AR7 than in the area AR6.

The particle size $D_{LL}$ of the fillers 63LL satisfies $D_{LL} > D_L$. The particle size $D_{LL}$ is, within a range not contradicting the condition of $D_{LL} > D_L$, a half of the distance $S_3$ or more, preferably ⅔ of the distance $S_3$ or more or preferably distance $S_3$ or more. For example, if the distance $S_3$ is 78 μm, the particle size $D_{LL}$ is 39 μm or more (particle size $D_L$ is less than 39 μm), preferably 52 μm or more (particle size $D_L$ is less than 52 μm) or preferably 78 μm or more. The upper limit value of the fillers 63LL is about a half of the total thickness of the SAW device 1 and is 300 μm as an example.

Note that, in the example of FIG. 8B, it is also possible to have only the fillers 63S and 63LL mixed into the resin 61, only the fillers 63S distributed in the areas AR1 and AR6, and the fillers 63S and 63LL distributed in the area AR7.

Figure 9A:
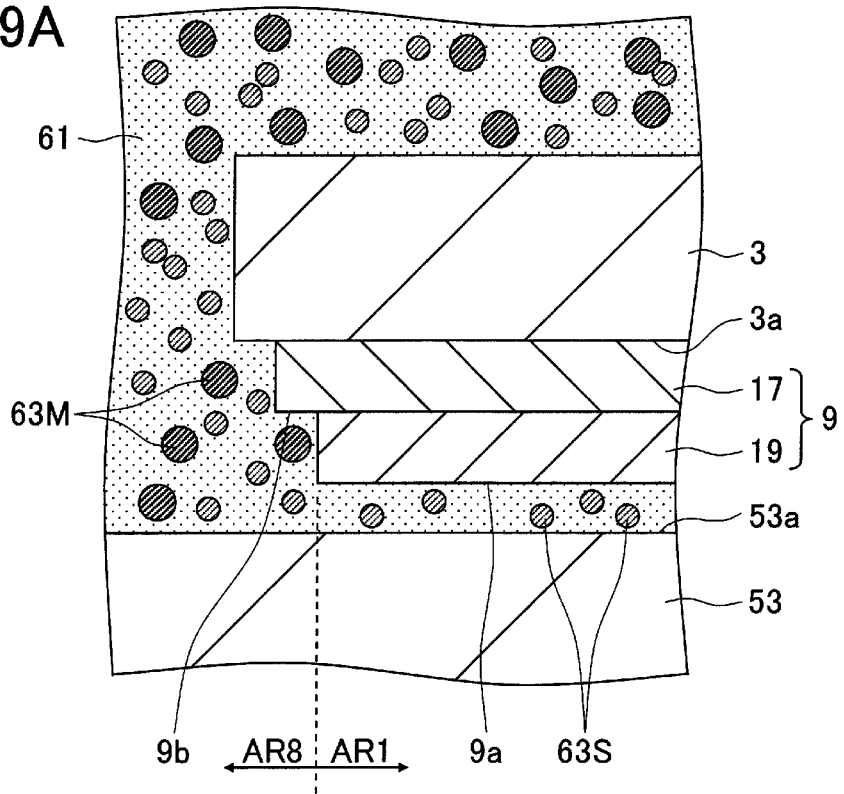
FIG. 9A and FIG. 9B are enlarged cross-sectional views showing modifications of the SAW device.
Figure 9B:
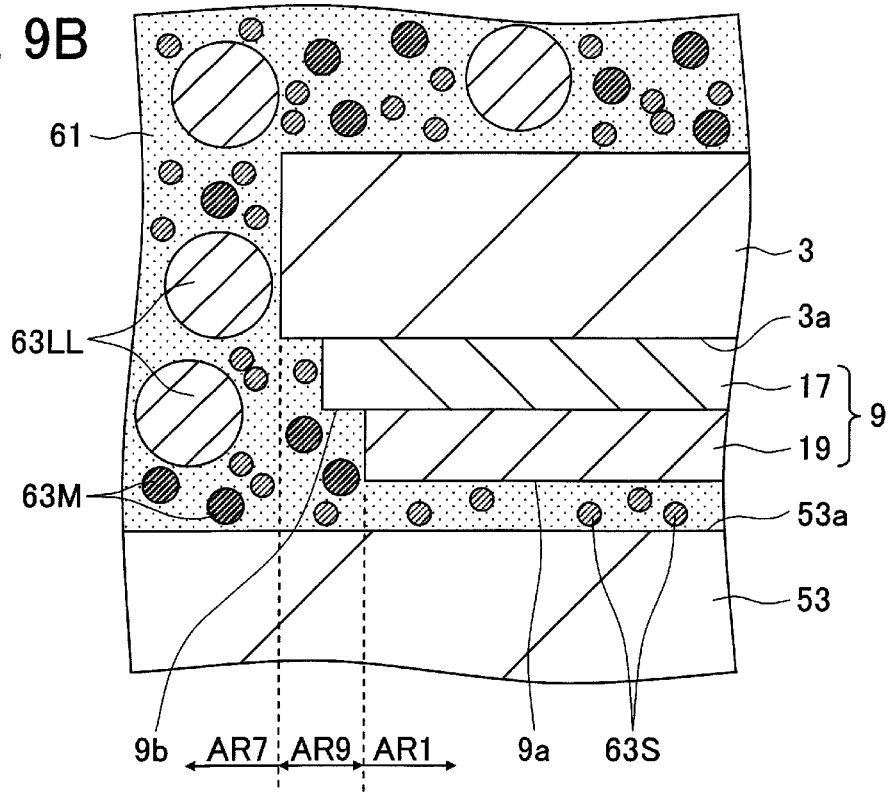

FIG. 9A and FIG. 9B differ from the embodiments only in the particle size of the fillers 63 contained in the resin 61.

In FIG. 9A, in the area AR1 between the first top surface 9a and the mounting surface 53a, only the fillers 63S are distributed, while in the area AR8 on the outer side of the same, the fillers 63S are distributed and the fillers 63M are distributed. That is, the fillers 63L are not distributed, and the distribution of the fillers 63 does not differ between the area between the first major surface 3a and the mounting surface 53a and the area between the second top surface 9b and the mounting surface 53a. Note that, the content of the fillers 63 is higher in the area AR8 than in the area AR1.

In FIG. 9B, in the area AR1 between the first top surface 9a and the mounting surface 53a, only the fillers 63S are distributed, in the area AR9 on the outer side of the same, the fillers 63S and 63M are distributed, and in the area AR7 on the further outer side of the same, the fillers 63S, 63M, and 63LL are distributed. That is, the distribution of the fillers 63 does not differ between the area between the first major surface 3a and the mounting surface 53a and the area between the second top surface 9b and the mounting surface 53a, but the distribution of the fillers 63 differs between these areas (AR9) and the area AR7 on the outer side of the same. Note that, the content of the fillers 63 is higher in the area AR9 than in the area AR1 and is higher in the area AR7 than in the area AR9.

Note that, in the example of FIG. 9B, it is also possible to have only the fillers 63S and 63LL mixed into the resin 61, only the fillers 63S distributed in the areas AR1 and AR9, and the fillers 63S and 63LL distributed in the area AR7. Further, in the examples of FIG. 9A and FIG. 9B, it is also possible to have only the fillers 63S and 63L mixed into the resin 61 and have the distribution of the fillers 63 made the same as that in FIG. 8A regardless of the existence of the second top surface 9b. Further, it is also possible to have only the fillers 63S, 63L, and 63LL mixed into the resin 61 and have the distribution of the fillers 63 made the same as that in FIG. 8B regardless of the existence of the second top surface 9b.

In the embodiment, the planar shape of the outer edge of the frame and the planar shape of the lid were formed as similar shapes, but they may also not be formed as similar shapes. Examples of the cover in which these planar shapes are not formed as similar shapes are shown in FIG. 10A and FIG. 10B.

Figure 10A:
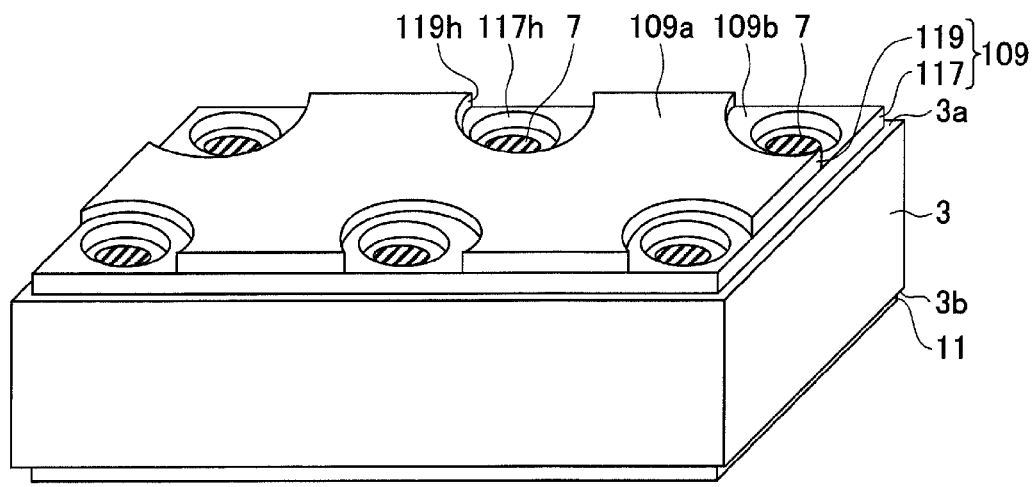
FIG. 10A and FIG. 10B are perspective views showing modifications of the SAW device.
Figure 10A:
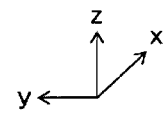

In a SAW device 101 in FIG. 10A, an outer edge of a frame 117 is formed in a rectangle, and openings 117h for exposing the pads 7 are formed. Note that, in the frame 117, in the same way as the frame 17 in FIG. 2, an opening configuring the vibration space 21 (not shown since it is closed by a lid 19) is formed. Further, the planar shape of the lid 119 is made a rectangle the same as the outer edge of the frame 117 wherein cutaway parts 119h are formed for exposing the openings 117h. Further, a first top surface 109a is configured by the top surface of the lid 119, and second top surfaces 109b are configured by portions in the top surface of the frame 117 which are exposed from the cutaway parts 119h.

Figure 10B:
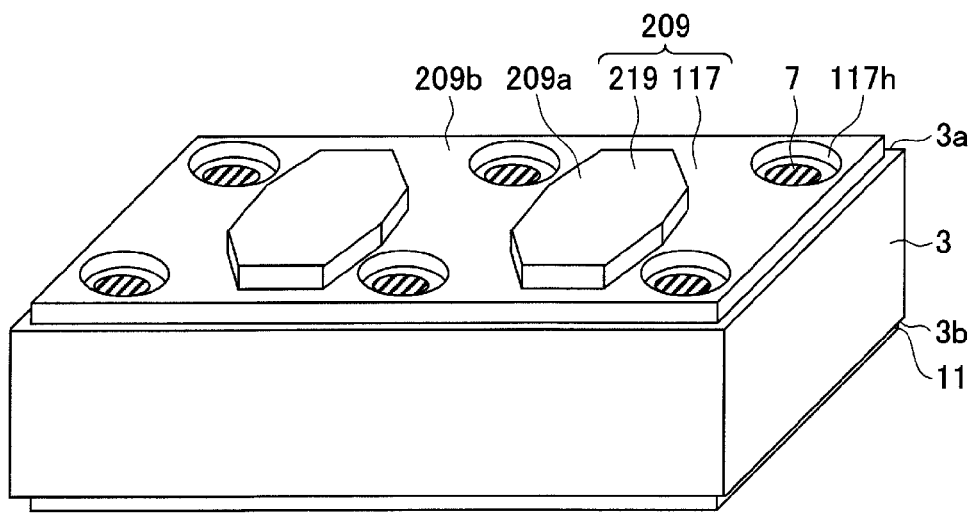
Figure 10B:
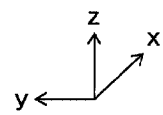

In a SAW device 201 in FIG. 10B, the frame 117 is made the same as that shown in FIG. 10A. A lid 219 is provided for each vibration space 21 (not shown since it is closed by the lid 219) and is formed as a similar shape with the vibration space 21. Further, one cover 209 is configured by one frame 117 and two lids 219. Note that, the two lids 219 may be grasped as one lid as well. Conversely, the frame 117 may be grasped as being divided by a suitable virtual line and the cover may be grasped as provided for each vibration space 21. Further, first top surfaces 209a are configured by the top surfaces of the lids 219, and second top surface 209b is configured by a portion in the top surface of the frame 117 which is exposed from the lids 219.

In the above embodiments, the area which has a high content of fillers and the area which contains fillers which have a large particle size coincided, but they need not coincide. In the same way, the area which has a high content of fillers and the area in which the gap to be filled with the sealing part is large need not coincide either. In other words, the adjustment of the content or particle sizes of the fillers is not limited to one by filtration of the resin containing the fillers by utilizing the change of the size of the gap. For example, the content or particle size can be changed at a suitable position by sequentially supplying resins having different contents of fillers or resins having different particle sizes of fillers to the periphery of the acoustic wave device.

The method of production of the acoustic wave device is not limited to that exemplified in the embodiments.

For example, the SAW devices may be mounted on a mother board from which a large number of mounting boards can be taken. Further, in this case, the SAW devices may be cut out from a mother board from which a large number of SAW devices can be taken, then mounted on the mother board of the mounting boards or may be mounted on the mother board of the mounting boards before being cut out.

Further, the bumps may be formed not on the SAW device, but on the mounting board. In this case, in the same way as the case where they are formed on the SAW device, so long as before the time when the SAW device is mounted on the mounting board, the bumps may be formed before cutting out a mounting board from a mother board of mounting boards or may be formed after cutting it out.

Further, in the case where the cut SAW devices are mounted on a mother board of mounting boards described above, the material which becomes the sealing parts (resin and fillers) may be supplied after the mother board of mounting boards is cut or may be supplied before cutting. Further, in the case where SAW devices before cutting are mounted on a mother board of mounting boards described above, the material which becomes the sealing parts may be supplied after the mother board of mounting boards is cut together with the mother board of SAW devices or may be supplied after only the mother board of SAW devices is cut (before cutting of the mother board of mounting boards).

Further, for example, in a cover not needing a vibration space, it is not necessary to separately form a frame and a lid. The entire cover may be formed integrally by one photolithography operation or the like. Further, for example, a cover needing a vibration space may be formed by forming a sacrificial layer in a region which becomes the vibration space, forming a resin layer which becomes the cover on the sacrificial layer, and melting the sacrificing layer to make it flow out of the interior of the resin layer.

REFERENCE SIGNS LIST

1 . . . SAW device (acoustic wave device), 3 . . . element substrate, 3a . . . first major surface, 5 . . . excitation electrode, 9 . . . cover, 53 . . . mounting board, 53a . . . mounting surface, 59 . . . sealing part, 61 . . . resin, and 63 . . . filler.

The invention claimed is:

1. An electronic component comprising:
a mounting board having a mounting surface,
an acoustic wave device mounted on the mounting surface, and
a sealing part covering the acoustic wave device and filled between the acoustic wave device and the mounting surface, wherein
the acoustic wave device has
an element substrate,
an excitation electrode provided on a major surface of the element substrate, and
a cover covering the excitation electrode and
is mounted on the mounting surface so as to make a top surface of the cover face the mounting surface,
the sealing part contains
a resin and
insulating fillers having a coefficient of thermal expansion lower than that of the resin, and the content of the fillers differs between an area including at least a portion of an area between the cover and the mounting surface and another area.

2. The electronic component as set forth in claim 1, wherein:
the major surface of the element substrate is exposed at the periphery of the cover, and
the content of the fillers is higher between the major surface and the mounting surface than between the cover and the mounting surface.

3. The electronic component as set forth in claim 2, wherein:
fillers which have particle sizes larger than the maximum particle size of the fillers which are distributed between the cover and the mounting surface are distributed between the major surface and the mounting surface.

4. The electronic component as set forth in claim 1, wherein:
the cover has
a first top surface which faces the mounting surface and
a second top surface which faces the mounting surface while separated from the mounting surface more than the first top surface, and
the content of the fillers is higher between the second top surface and the mounting surface than between the first top surface and the mounting surface.

5. The electronic component as set forth in claim 4, wherein:
the cover has
a frame surrounding the excitation electrodes when viewing the major surface of the element substrate by a plane view and
a lid which is superimposed on the frame so as to close the opening of the frame, and
the first top surface is configured by the top surface of the lid, and the second top surface is configured by a portion in the top surface of the frame which is exposed from the lid.

6. The electronic component as set forth in claim 5, wherein the second top surface is configured by the portion in the top surface of the frame which is exposed from the peripheral sides of the lid.

7. The electronic component as set forth in claim 4, wherein
fillers which have particle sizes larger than the maximum particle size of the fillers which are distributed between the first top surface and the mounting surface are distributed between the second top surface and the mounting surface.

8. The electronic component comprising:
a mounting board having a mounting surface,
an acoustic wave device mounted on the mounting surface, and
a sealing part covering the acoustic wave device and filled between the acoustic wave device and the mounting surface, wherein
the acoustic wave device has
an element substrate,
an excitation electrode provided on a major surface of the element substrate, and
a cover covering the excitation electrode and is mounted on the mounting surface so as to make a top surface of the cover face the mounting surface,
the sealing part contains
a resin and
insulating fillers which have a coefficient of thermal expansion lower than that of the resin, and
fillers having a particle size larger than the particle size of the fillers distributed in the area including at least a portion of the area between the cover and the mounting surface are distributed in another area.

9. The electronic component as set forth in claim 2, wherein:
the cover has
a first top surface which faces the mounting surface and
a second top surface which faces the mounting surface while separated from the mounting surface more than the first top surface, and
the content of the fillers is higher between the second top surface and the mounting surface than between the first top surface and the mounting surface.

10. The electronic component as set forth in claim 3, wherein:
the cover has
a first top surface which faces the mounting surface and
a second top surface which faces the mounting surface while separated from the mounting surface more than the first top surface, and
the content of the fillers is higher between the second top surface and the mounting surface than between the first top surface and the mounting surface.

11. The electronic component as set forth in claim 9, wherein:
the cover has
a frame surrounding the excitation electrodes when viewing the major surface of the element substrate by a plane view and
a lid which is superimposed on the frame so as to close the opening of the frame, and
the first top surface is configured by the top surface of the lid, and the second top surface is configured by a portion in the top surface of the frame which is exposed from the lid.

12. The electronic component as set forth in claim 10, wherein:
the cover has
a frame surrounding the excitation electrodes when viewing the major surface of the element substrate by a plane view and
a lid which is superimposed on the frame so as to close the opening of the frame, and
the first top surface is configured by the top surface of the lid, and the second top surface is configured by a portion in the top surface of the frame which is exposed from the lid.

13. The electronic component as set forth in claim 11, wherein the second top surface is configured by the portion in the top surface of the frame which is exposed from the peripheral sides of the lid.

14. The electronic component as set forth in claim 12, wherein the second top surface is configured by the portion in the top surface of the frame which is exposed from the peripheral sides of the lid.

15. The electronic component as set forth in claim 9, wherein
fillers which have particle sizes larger than the maximum particle size of the fillers which are distributed between the first top surface and the mounting surface are distributed between the second top surface and the mounting surface.

16. The electronic component as set forth in claim 10, wherein
fillers which have particle sizes larger than the maximum particle size of the fillers which are distributed between the first top surface and the mounting surface are distributed between the second top surface and the mounting surface.

17. The electronic component as set forth in claim 5, wherein fillers which have particle sizes larger than the maximum particle size of the fillers which are distributed between the first top surface and the mounting surface are distributed between the second top surface and the mounting surface.

18. The electronic component as set forth in claim 11, wherein fillers which have particle sizes larger than the maximum particle size of the fillers which are distributed between the first top surface and the mounting surface are distributed between the second top surface and the mounting surface.

19. The electronic component as set forth in claim 12, wherein fillers which have particle sizes larger than the maximum particle size of the fillers which are distributed between the first top surface and the mounting surface are distributed between the second top surface and the mounting surface.

20. The electronic component as set forth in claim 6, wherein fillers which have particle sizes larger than the maximum particle size of the fillers which are distributed between the first top surface and the mounting surface are distributed between the second top surface and the mounting surface.

* * * * *